(12) United States Patent
Borenstein et al.

(10) Patent No.: US 10,572,115 B2
(45) Date of Patent: Feb. 25, 2020

(54) SYSTEMS AND METHODS FOR TRACKING PROGRESS OF DESIGN OF A SEMICONDUCTOR DEVICE

(71) Applicant: Mellanox Technologies Ltd., Yokneam (IL)

(72) Inventors: Yuval Borenstein, Raananna (IL); Amir Levy, Ramat Ha'Shofet (IL); David Barkai, Tel Aviv (IL)

(73) Assignee: Mellanox Technologies Ltd., Yokneam (IL)

( * ) Notice: Subject to any disclaimer, the term of this patent is extended or adjusted under 35 U.S.C. 154(b) by 83 days.

(21) Appl. No.: 15/885,730

(22) Filed: Jan. 31, 2018

(65) Prior Publication Data

US 2019/0235713 A1    Aug. 1, 2019

(51) Int. Cl.
*G06F 17/50*    (2006.01)
*G06F 3/0484*    (2013.01)

(52) U.S. Cl.
CPC .......... *G06F 3/0484* (2013.01); *G06F 17/504* (2013.01)

(58) Field of Classification Search
CPC .............................. G06F 17/504; G06F 3/0484
USPC ......................................... 716/110, 111, 113
See application file for complete search history.

(56) References Cited

U.S. PATENT DOCUMENTS

| | | | |
|---|---|---|---|
| 7,404,120 B1 * | 7/2008 | Ingoldby .......... | G01R 31/31725 714/25 |
| 7,886,242 B1 * | 2/2011 | Chakraborti et al. ....... | G01R 31/31830 716/106 |
| 8,413,088 B1 * | 4/2013 | Armbruster et al. ........ | G06F 17/504 716/100 |
| 8,527,936 B2 * | 9/2013 | Jain et al. ............ | G06F 17/5022 716/103 |
| 8,997,034 B2 * | 3/2015 | Chang et al. ....... | G06F 17/5081 703/13 |
| 9,098,635 B2 * | 8/2015 | Peri-Glass et al. ......... | G06F 11/3688 |

(Continued)

OTHER PUBLICATIONS

Darbari, "RedisCovering Coverage" , 2017, OneSpin Solutions, Verification Furthures, one set (25 pages).*

*Primary Examiner* — Sun J Lin
(74) *Attorney, Agent, or Firm* — Finnegan, Henderson, Farabow, Garrett & Dunner, LLP

(57) ABSTRACT

Systems and methods are provided for tracking a progress of design of a semiconductor device. In one embodiment, a method comprises receiving identification information identifying a set of tests for verification of a design under test (OUT) and generating a verification environment based on the identification information. The method further comprises generating hardware verification language coverage code corresponding to the verification environment, the hardware verification language code specifying steps for performance of the set of tests in the verification environment and generating a request for execution of the hardware verification language code. The method further comprises receiving coverage results verification information reporting results of execution of performance of the set of tests, storing the results in a database, and analyzing the results. The method also comprises identifying a verification hole, and generating a request to modify the set of tests in the verification environment, based on the verification hole. Finally, the method comprises generating a report presenting the results.

20 Claims, 5 Drawing Sheets

(56) References Cited

U.S. PATENT DOCUMENTS

| | | | | |
|---|---|---|---|---|
| 9,355,206 B2* | 5/2016 | Ikram et al. | ......... | G06F 17/5045 |
| 9,619,597 B1* | 4/2017 | Sherer et al. | ......... | G06F 17/504 |
| 10,133,683 B1* | 11/2018 | Singh et al. | ......... | G06F 13/105 |
| 2015/0302133 A1* | 10/2015 | Ikram et al. | ......... | G06F 17/5045 |
| | | | | 716/111 |

* cited by examiner

| | Subject | Assignee | Create Main Feature | Coded | Occurred |
|---|---|---|---|---|---|
| | ~~Latency Verifier Fast Mode~~ | ~~General~~ | ☑ | ~~false~~ | ~~false~~ |
| | BW Verifier | General | ☑ | false | false |
| | Fast Test | General | ☑ | false | false |
| | Slow Test | General | ☑ | false | false |
| | BW Test | General | ☐ | false | false |
| ⊖ | General | General | ☐ | false | false |
| ⊖ | truncation | General | ☐ | false | false |
| | mirror | General | ☑ | false | false |
| ⊖ | almost end | General | ☐ | false | false |
| | sma | General | ☑ | false | false |
| ⊖ | regular tq | General | ☑ | false | false |
| | coalesce | General | ☑ | false | false |
| ⊖ | PacketSizes | General | ☐ | false | false |
| | Jumbo | General | ☑ | false | false |
| | Mini | General | ☑ | false | false |
| | Rib | General | ☑ | false | false |

[Show Graph] — 304 Subject, 306 Assignee, 302 Create Main Feature, 308 Coded, 310 Occurred Total Items: 27

SYSTEMS AND METHODS FOR TRACKING PROGRESS OF DESIGN OF A SEMICONDUCTOR DEVICE

BACKGROUND

In the semiconductor industry, the process of designing a semiconductor device, or "chip," becomes more and more complicated as the number of individual components on the chip increases. However, having a design error can be disastrous. Thus, an important step in the electronic design process is verification of the design, that is, a confirmation that the device performs in the specific manner that was intended. When verification is not performed on time, projects suffer from delay, quality is jeopardized, and the risk soars. Therefore, monitoring the verification progress is crucial.

Verification monitoring gives the team managing the design a sense of the progress of verification and helps determine when the design is robust enough for "tape out," that is, to release for production. Existing techniques for reporting verification monitoring have a number of drawbacks. First, the verification monitoring data is not real-time. Second, the techniques required for monitoring may not be convenient for the verification engineers or the managerial team. Third, process automation may be difficult to implement. It is therefore desirable to provide systems and methods which address these issues.

SUMMARY

A method is provided for tracking progress of design of a semiconductor device. The method comprises receiving identification information identifying a set of tests for verification of the design under test (DUT) and generating a verification environment based on the information. The method further comprises generating hardware verification language code corresponding to the verification environment, the hardware verification language code specifying steps for performance of the tests in the verification environment and generating a request for execution of the hardware verification language code. The method further comprises receiving verification information reporting execution results of performance of the tests, storing the results in a database, and analyzing the results. The method also comprises identifying a verification hole, and generating a request to modify the test set in the verification environment, based on the verification hole. Finally, the method comprises generating a report presenting the results.

In another aspect, the invention provides a non-transitory computer readable medium storing instructions which, when executed, cause at least one processor to perform operations for tracking progress of design of a semiconductor device. The operations comprise receiving identification information identifying a set of tests for verification of the design under test (DUT), generating a verification environment based on the information, and generating hardware verification language code corresponding to the verification environment, the hardware verification language code specifying steps for performance of the tests in verification environment. The operations further comprise generating a request for instruction of execution of the hardware verification language code; receiving verification information reporting execution results of performance of the tests and the coverage results; storing the results in a database; analyzing the results; identifying a verification hole; generating a request to add or remove tests from verification environment, based on the verification hole; and generating a report presenting the results.

In yet another aspect, a computerized system for tracking progress of the design of a semiconductor device is provided. The system comprises an I/O interface, a display device, a database, a memory storing instructions, and a processor configured to execute the instructions to perform operations. The operations comprise receiving identification information identifying tests for verification of the design under test (DUT); generating a verification environment based on the information; and generating hardware verification language code for corresponding to the verification environment, the hardware verification language code specifying steps for performance of the tests in the verification environment. The operations further comprise generating a request for instruction of execution of the hardware verification language code; receiving verification information reporting execution results of performance of the tests; storing the results in a database; and analyzing the results. The operations also comprise identifying a verification hole; generating a request to add or remove tests from verification environment, based on the verification hole; and generating a report presenting the results.

BRIEF DESCRIPTION OF THE DRAWINGS

The accompanying drawings, which are incorporated in and constitute a part of this specification, illustrate several embodiments and, together with the description, serve to explain the disclosed principles. In the drawings:

FIG. 3 illustrates an exemplary user interface, consistent with disclosed embodiments, for selecting operations to verify a design of a semiconductor device.

DETAILED DESCRIPTION

Reference will now be made in detail to exemplary embodiments, examples of which are illustrated in the accompanying drawing and disclosed herein. Wherever convenient, the same reference numbers will be used throughout the drawings to refer to the same or like parts.

Figure 1:
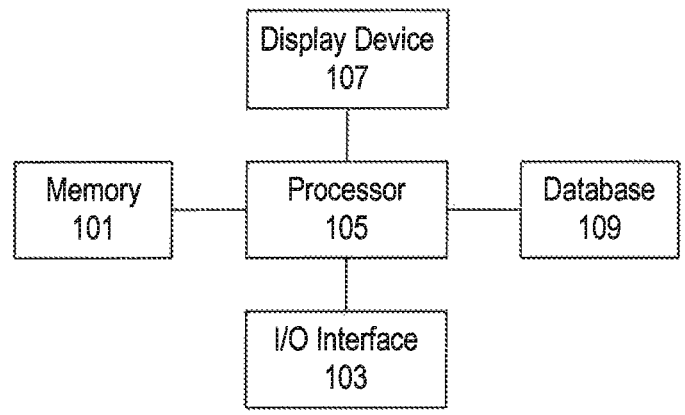
FIG. 1 is a block diagram of an exemplary system for tracking progress of design of a semiconductor device, consistent with disclosed embodiments.

FIG. 1 is a block diagram of a system 100 that may be configured to perform methods consistent with disclosed embodiments, when executed by one or more processors. The components and arrangements shown in FIG. 1 are not intended to limit the disclosed embodiments, as the components used to implement the disclosed processes and features may vary.

As shown in FIG. 1, system 100 may include a processor 105, a memory 101, a database 109, an I/O interface 103, and a display device 107. I/O interface 103 may be communicatively coupled to the processor 105. Processor 105 may be configured to receive information identifying tests and features for verification of the design from I/O interface 103. For example, I/O interface 103 may be a keyboard, a computer mouse, or a touch screen, etc. that enables system 100 to receive input from a user. Memory 101 may be communicatively coupled to processor 105. Processor 105 may be configured to store information in memory 101. For example, processor 105 receives a request for information from I/O interface 103. Processor 105 may then store the information in memory 101 and retrieve the information in a later time.

Database 109 may be communicatively coupled to processor 105. After a test is performed, processor 105 may be configured to store the test results in database 109 and retrieve information stored in database 109.

Display device 107 may be communicatively coupled to processor 105. Display device may be configured to receive a request from a processor (e.g., processor 105) and display the test results. For example, the display device may be a screen, a monitor, or an output device (e.g., a printer).

The verification process for the design of a device consists of performing a plurality of individual tests to verify the design under test (DUT), that is, the device whose design is being checked. The tests verify the features of the DUT, features being the specific functions that the DUT exhibits or requires. For example, to check a "mirroring" feature of a DUT, system 100 may perform a test that determines if packets are accurately duplicated upon receipt of appropriate instructions. In another example, to check "truncation" feature, system 100 may perform a test that determines if a packet is accurately truncated when it is out by the DUT.

In some instances, the tests are performed by software simulators. Software simulators read hardware description languages (HDL) (e.g., Verilog, VHDL, etc.) and generate a "test bench" or "verification environment", which is used to confirm that the function and operation of the DUT is correct. This is done by generating and supplying sets of predefined input signals to the DUT, monitoring the resulting output signals from the DUT, and comparing these output signals with the expected output. In many instance, the test bench is coded in "hardware verification language" (HVL) (e.g., "e", SystemVerilog, etc.). In order to discover all possible design errors, or "bugs," in a DUT, all possible "scenarios", that is, sets of predefined input signals, should be generated and supplied to the DUT. The more scenarios that are presented, the lower is the probability error that the DUT has a design error and the higher is the quality of the design. To track a verification progress, a user will desire to track the various scenarios in the tests.

"Coverage" is a way to measure the quality of scenarios generated in the tests. Coverage can refer to "code coverage" and "functional coverage." Code coverage refers to the HDL code that is generated for test simulations. On the other hand, functional coverage refers to functions or logic that defined by the user. HVL is used to describe the functions or logics the user wants to verify.

For both coverage methods, the coverage of each test is saved in a "file", that is, a format that can be presented to the simulator. The simulator may contain an option to merge multiple files for different tests, and preset the total coverage of a plurality of tests.

After the tests are performed, results are generated by the simulator and the test results are received by processor 105. Processor 105 may analyze the results and identify any "verification holes," that is, missing values in a specific set of inputs to the DUT. Thus, processor 105 may then automatically remove or add tests to modify the verification environment, eliminating the verification holes to achieve a greater coverage.

Additionally, corresponding to the received information, processor 105 may also update and revise the information in memory 101. For example, when a user requests to track a feature and perform another test on the simulated DUT, i.e., add another test to the verification environment, the user may enter the request using an I/O interface (e.g., I/O interface 103). Processor 105 may be configured to receive the request to add another test to the verification and store this request information in a memory (e.g., memory 101). In response to the request of adding another test to the verification environment, processor 105 may generate hardware verification language to be executed by the simulation program and perform the requested test. Consequently, when generating reports representing the test results, processor 105 may include the additional test results in the reports.

On the other hand, when a user decides not to track a feature and requests that a test be removed from the verification environment, the user may enter the request using an I/O interface 103. Processor 105 may be configured to receive the request to remove a test from the verification environment and store this request information in a memory (e.g., memory 101). In addition, processor 105 may discontinue monitoring the results of the removed test. Alternatively, processor 105 may maintain monitoring of the removed test in the backend. And, when generating the reports representing the test results, processor 105 may prevent the removed test results from being presented in the report.

Furthermore, a method for tracking progress of design of a semiconductor device can be executed on a periodic basis, using, e.g., a Unix cron job or a Windows Scheduled Task. For example, a user may request a report presenting the results to be generated every morning. Processor 105 may receive scheduling information. Based on the information, processor 105 may generate code that specifies a desired time and, once the time is reached, processor 105 may perform the method for tracking progress of design of a semiconductor device.

Figure 2:
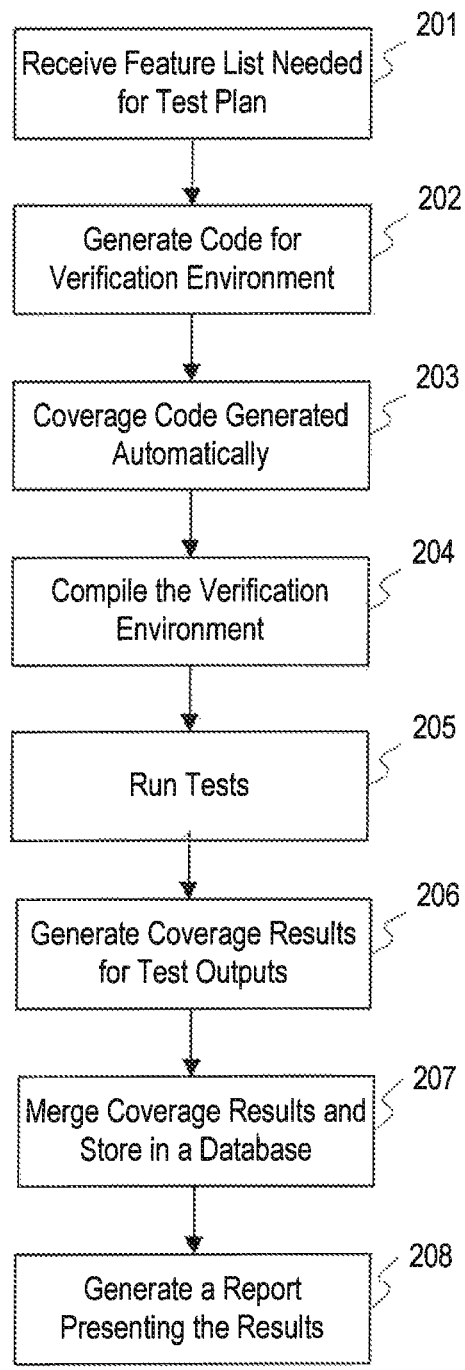
FIG. 2 is a flowchart of an exemplary method for tracking progress of design of a semiconductor device, consistent with disclosed embodiments.

FIG. 2 is a flowchart of example method 200 for tracking progress of design of a semiconductor device, consistent with embodiments of the present disclosure. Method 200 enhances the efficiency and effectiveness of the semiconductor design process by providing real-time monitoring of the verification progress. By automatically generating hardware verification language code, requesting execution of the hardware verification language, and reporting on the test results, method 200 further eases workload of the verification engineers who are required to code the coverage item and collect the results.

In step 201, processor 105 receives a feature list that is needed for a test plan from an I/O interface (e.g., I/O interface 103) identifying tests to be performed in verification of the DUT, examples of which are discussed in more detail with respect to FIG. 3, below. In step 202, based on the received feature list, processor 105 generates code in hardware verification language (e.g., SystemVerilog, OpenVera, e, SystemC, etc.) that may be supplied to the verification environment to perform the identified tests. In step 203, processor 105 may automatically generate a request to execute the hardware verification language code, including coverages. In step 204, processor 105 may compile the verification environment. In step 205, processor 105 may perform the tests. Alternatively, in some embodiments, the tests may be performed by another processing system. As an output, a coverage report may be generated.

In step 206, after a test is performed, processor 105 receives verification information reporting results of performance of the tests and/or the results of the coverages. The results may be Boolean data. In step 207, processor 105 stores the results in a database (e.g., database 109). Step 208, may further include processor 105 retrieving information from the database and generating reports presenting the test results.

FIG. 3 illustrates an exemplary user interface 300 by which the user can monitor the verification process. User interface 300 includes "Subject" column 304, "Assignee" column 306, "Create Main Feature" column 302, "Coded" column 308, and "Occurred" column 310. The user may view all of the available features under "Subject" column 304. In addition, the user may select various features to be added to coverage generation in order to be monitored by checking the boxes under "Create Main Feature" column 302, by checking the box according to each feature. This enables the users to add or remove desired features collecting in a simple and instantaneous way. Assignee's names may be displayed to each feature under "Assignee" column 306. "Coded" column 308 shows the features that hardware verification language specifying steps for performance of the identified features that have already been generated. "Occurred" column 310 shows the features that have already been covered. User interface 300 allows a user to add or remove a feature from tracking by simply checking or unchecking a box. Furthermore, a user may quickly realize the progress of the features covered in the tests.

Figure 4:
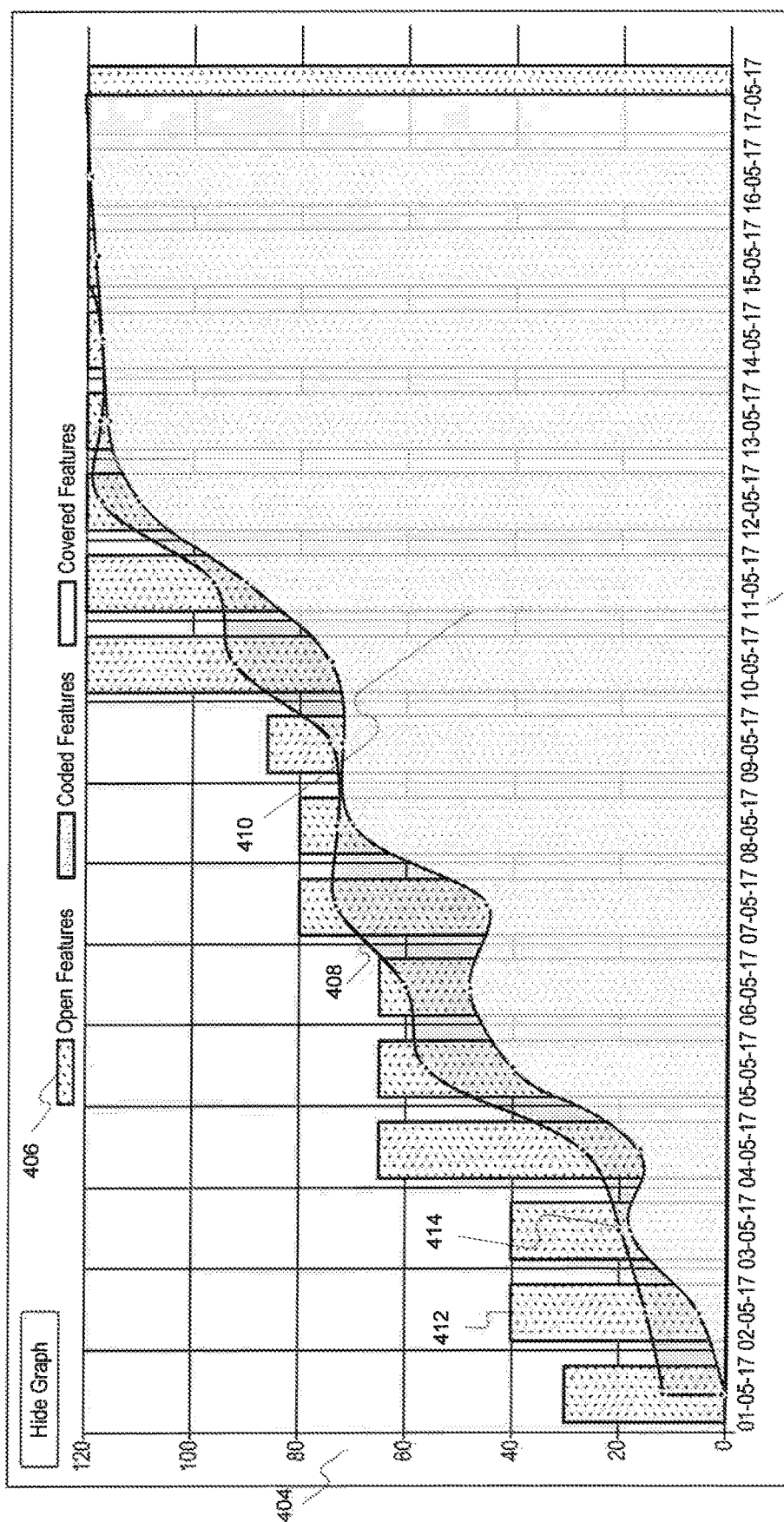
FIG. 4 is an exemplary report generated by the system of FIG. 1.
Figure 5:
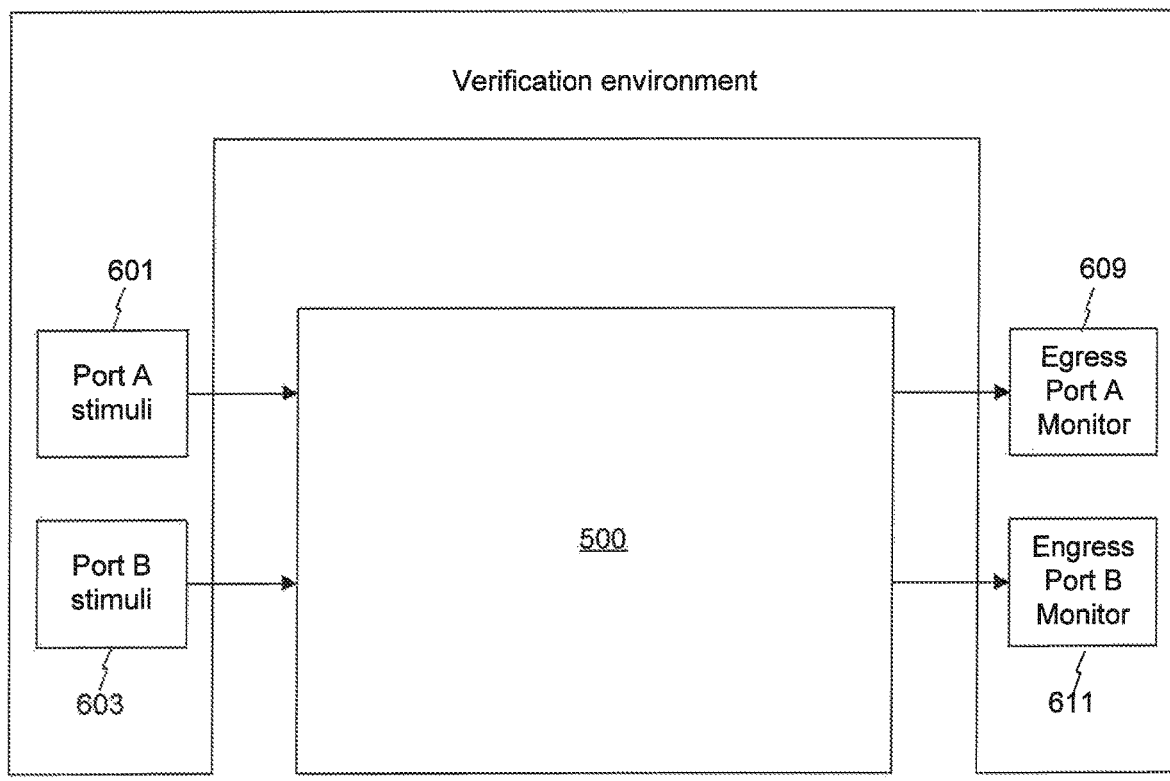
FIG. 5 illustrates of an exemplary verification environment, consistent with disclosed embodiments.

FIG. 4 shows an exemplary report 400 generated by system 100, consistent with the disclosed embodiments. As shown in FIG. 4, axis 402 represents dates, and axis 404 represents the number of features. The bars in pattern 406 show the number of features a user selected to monitor on different dates. For example, bar 412 shows that there are 40 features in total that are selected to be monitored on May 2, 2017.

The darker grey area 408 represents the number of features for which system 100 has already generated hardware verification language code for the features. For example, dot 414 represents that on May 3, 2017, system 100 has generated hardware verification language for 20 features among the 40 features selected to be monitored. The light grey area 410, on the other hand, represents the number of features that have been passed on different dates. For example, as shown in FIG. 4, on May 17, 2017, there are 120 feature that are selected to be monitored, code for all of them has been generated, and all have been passed. By using report 400, a user may determine the number of features that have been covered out of the total number of features that are selected to be monitored. A user may easily perceive the progress of verification by using report 400 in FIG. 4.

Furthermore, the reports may include percentages of features that have been covered by the tests. The reports may also include indicators, such as a process indicator that represents efficiency or productivity, a leading indicator that can predict the progress of the verification, etc. In addition, the report may be automatically generated on a periodic basis using the schedule function explained above. The reports provide to the team managing the design a sense of the progress of verification, help determine when the design is sufficiently robust for "tape out" on a real-time basis, and make it more convenient for the verification engineers.

For a verification environment to verify a DUT, the verification environment stimulates the DUT and observes the response from the DUT. FIG. 6 illustrates an exemplary verification environment 600, consistent with disclosed embodiments. After coverage codes are generated, processor 105 may run the verification environment 600, based on the coverage codes. Verification environment 600 may include port A stimulus driver 601, port B stimulus driver 603, egress port A monitor 609, and egress port B monitor 611.

For different tests, port A and port B stimulus drivers 601 and 603 may generate different inputs and send the inputs to DUT 500. In response, DUT 500 may generate output signals, according to the inputs. Egress port A monitor 609 and egress port B monitor 611 may check the output signals from DUT 500 and compare them to the desire results. Furthermore, egress port monitors 609 and 611 may determine pass/fail information for a test, based on the comparison.

Verification environment 600 transforms test cases into physical stimuli to DUT 500. Processor 104 may generate test cases in form of software language, which may be native to the DUT 500, based on the received information. The test cases may be configured to control processor registers for generating stimulus inputs.

DUT 500 represents a semiconductor device whose design is being checked. DUT 500 may be simulated based on the RTL code. DUT 500 may receive input signals from port A and port B stimulus drivers 601 and 603. Then, DUT 500 may generate output results based on the input signals.

Based on the above, the disclosed system and method improve verification monitoring process by providing real-time test results. And it is convenient for the verification engineers or the managerial team, because the disclosed embodiments automatically generates hardware verification language for tests and requests to execute hardware verification language that performs the tests, and automatically generates reports for the test results.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. A method for tracking a progress of design verification of a semiconductor device, the method comprising:
receiving identification information identifying a set of features for verification of a design under test (OUT);
generating a verification environment based on the identification information;
generating hardware verification language code corresponding to the verification environment, the hardware verification language code specifying coverage code for executing a set of tests in the verification environment;
generating a request to execute the hardware verification language code;

receiving verification information reporting results of execution of performance of the set of tests;
storing the results in a database;
analyzing the results;
identifying a verification hole;
generating a request to modify the set of tests in the verification environment by performing at least one of adding a test to the set of tests or removing a test from the set of tests, based on the verification hole; and
generating a report presenting the results.

2. The method of claim 1, further comprising, receiving scheduling information.

3. The method of claim 2, further comprising, generating a report presenting the results in accordance with the received scheduling information.

4. The method of claim 1, wherein the generated report comprises at least one of:
a coverage percentage information;
a graphic representation for coverage indicator; or
a graphic representation for historical coverage information.

5. The method of claim 1, wherein receiving the identification information comprises receiving a request to add a feature to the set of features.

6. The method of claim 1, wherein receiving the identification information comprises receiving a request to remove a feature from the set of features.

7. The method of claim 1, further comprising, storing the received identification information in a memory.

8. The method of claim 7, further comprising, generating a report presenting the results corresponding to the stored received identification information.

9. The method of claim 1, wherein the storing the results in a database comprises creating a file specifying the verification information reporting the results of performance of the set of tests.

10. The method of claim 1, further comprising:
generating software language code corresponding to the received identification information; and
generating hardware verification language code corresponding to the received identification information, the hardware verification language code specifying steps for performance of the set of tests, based on the software language code.

11. A non-transitory computer-readable medium storing instructions which, when executed by at least one processor, cause the at least one processor to perform a method for tracking progress of design of a semiconductor device, the method comprising:
receiving identification information identifying a set of features for verification of a design under test (OUT);
generating a verification environment based on the identification information;
generating hardware verification language code corresponding to the verification environment, the hardware verification language code specifying steps for performance of a set of tests in the verification environment;
generating a request to execute the hardware verification language code;
receiving verification information reporting execution results of performance of the set of tests;
storing the results in a database; analyzing the results;
identifying a verification hole;
generating a request to modify the set of tests in the verification environment by performing at least one of adding a test to the set of tests or removing a test from the set of tests, based on the verification hole;
and generating a report presenting the results.

12. The method of claim 11, further comprising, receiving scheduling information.

13. The method of claim 12, further comprising, generating a report presenting the results in accordance with the received scheduling information.

14. The method of claim 11, wherein the receiving identification information comprises receiving a request to add a feature to the set of features.

15. A computerized system for tracking progress of design of a semiconductor device, the computerized system comprising:
an I/O interface; a display device;
a database;
a memory storing instructions; and
a processor configured to execute the instructions to perform operations comprising:
receiving identification information identifying a set of features for verification of a design under test (DUT);
generating a verification environment based on the identification information;
generating hardware verification language code corresponding to the verification environment, the hardware verification language code specifying steps for performance of a set of tests in the verification environment;
generating a request to execute the hardware verification language code;
receiving verification information reporting results of execution of performance of the set of tests;
storing the results in a database; analyzing the results;
identifying a verification hole;
generating a request to modify the set of tests in the verification environment by performing at least one of adding a test to the set of tests or removing a test from the set of tests, based on the verification hole; and
generating a report presenting the results.

16. The system of claim 15, wherein the operations further comprise:
receiving scheduling information.

17. The system of claim 16, wherein the operations further comprise:
generating a report presenting the results in accordance with the received scheduling information.

18. The system of claim 15, wherein the operations further comprise:
storing the received identification information in the memory.

19. The system of claim 18, wherein the operations further comprise: generating a report presenting the results corresponding to the stored received identification information.

20. The system of claim 15, wherein the operations further comprise:
creating a file storing the verification information.

* * * * *

UNITED STATES PATENT AND TRADEMARK OFFICE
CERTIFICATE OF CORRECTION

PATENT NO.       : 10,572,115 B2
APPLICATION NO.  : 15/885730
DATED            : February 25, 2020
INVENTOR(S)      : Yuval Borenstein et al.

It is certified that error appears in the above-identified patent and that said Letters Patent is hereby corrected as shown below:

On the Title Page

Item (57), Line 5 of ABSTRACT, "(OUT)" should read --(DUT)--.

In the Claims

Claim 1, Column 6, Line 58, "(OUT)" should read --(DUT)--.

Claim 11, Column 7, Line 51, "(OUT)" should read --(DUT)--.

Signed and Sealed this
Eighteenth Day of August, 2020

Andrei Iancu
*Director of the United States Patent and Trademark Office*